(12) United States Patent
Shih et al.

(10) Patent No.: US 11,908,765 B2
(45) Date of Patent: Feb. 20, 2024

(54) SEMICONDUCTOR STRUCTURE WITH HEATING ELEMENT

(71) Applicant: Taiwan Semiconductor Manufacturing Company, Ltd., Hsinchu (TW)

(72) Inventors: Chih-Tsung Shih, Hsinchu (TW); Chewn-Pu Jou, Hsinchu (TW); Stefan Rusu, Sunnyvale, CA (US); Feng-Wei Kuo, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/853,924

(22) Filed: Jun. 30, 2022

(65) Prior Publication Data

US 2022/0336313 A1 Oct. 20, 2022

Related U.S. Application Data

(63) Continuation of application No. 17/109,157, filed on Dec. 2, 2020, now Pat. No. 11,424,175.

(60) Provisional application No. 62/946,950, filed on Dec. 11, 2019.

(51) Int. Cl.
H01L 23/34 (2006.01)
(52) U.S. Cl.
CPC .................. H01L 23/345 (2013.01)

(58) Field of Classification Search
CPC .................................................... H01L 23/345
USPC ............................................................ 257/231
See application file for complete search history.

(56) References Cited

U.S. PATENT DOCUMENTS

| 2013/0044973 A1* | 2/2013 | Akiyama | G02F 1/0121 385/2 |
| 2014/0376851 A1* | 12/2014 | Akiyama | G02F 1/025 385/2 |

FOREIGN PATENT DOCUMENTS

WO WO-2015124953 A1 * 8/2015 ............. B82Y 20/00

\* cited by examiner

*Primary Examiner* — Ajay Arora
(74) *Attorney, Agent, or Firm* — JCIPRNET

(57) ABSTRACT

A semiconductor structure includes a semiconductor substrate, a semiconductor device and a heating structure. The semiconductor substrate includes a device region and a heating region surrounding the device region. The semiconductor device is located on the device region. The heating structure is located on the heating region and includes an intrinsic semiconductor area, at least one heating element and at least one heating pad. The intrinsic semiconductor area is surrounding the semiconductor device. The at least one heating element is located at a periphery of the intrinsic semiconductor area. The at least one heating pad is joined with the at least one heating element, wherein the at least one heating pad includes a plurality of contact structures, and a voltage is supplied from the plurality of contact structures to control a temperature of the at least one heating element.

20 Claims, 10 Drawing Sheets

SEMICONDUCTOR STRUCTURE WITH HEATING ELEMENT

CROSS-REFERENCE TO RELATED APPLICATION

This application is a continuation application of U.S. application Ser. No. 17/109,157, filed on Dec. 2, 2020, now allowed. The prior U.S. application Ser. No. 17/109,157 claims the priority benefit of U.S. provisional application Ser. No. 62/946,950, filed on Dec. 11, 2019. The entirety of the above-mentioned patent application is hereby incorporated by reference herein and made a part of this specification.

BACKGROUND

Optical signals are usable for various applications including high speed and secure data transmission between two devices. In some applications, a device capable of optical data transmission includes at least an integrated circuit (IC or "chip") having a laser die for transmitting and/or receiving optical signals. Also, the device usually has one or more other photonic/optical or electrical components, a waveguide for the transmission of the optical signals, and a support, such as a substrate of a printed circuit board, on which the chip equipped with the laser die and the one or more other components are mounted. The performance of photonic or optical components may be affected due to the dimension tolerance from fabrication or due to the changes in material properties from environment or processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
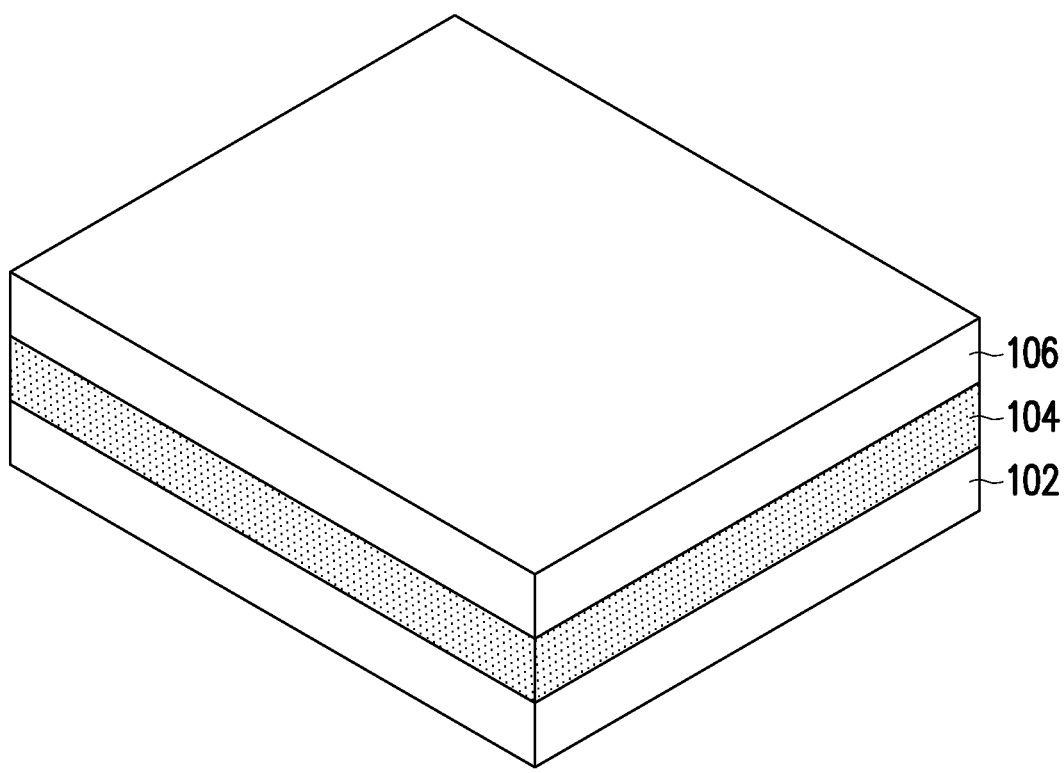
FIG. 1 to FIG. 3C are schematic views of various stages in a method of fabricating a semiconductor structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 3C are schematic views of various stages in a method of fabricating a semiconductor structure according to some exemplary embodiments of the present disclosure. Referring to FIG. 1, a semiconductor substrate 102 is provided. The semiconductor substrate 102 may be a silicon substrate, silicon-based substrates or other types of semiconductor substrates, for example. In some embodiments, an insulating layer 104 is formed on the semiconductor substrate 102, The insulating layer 104 may be a silicon oxide layer or be made of other types of insulating materials. The disclosure is not limited thereto. In some embodiments, a semiconductive material layer 106 is formed on the insulating layer 104. In certain embodiments, the semiconductive material layer 106 may be used to define at least one semiconductor device thereon as shown in subsequent steps. In some embodiments, the semiconductive material layer 106 may include a silicon layer, for example.

Figure 2A:
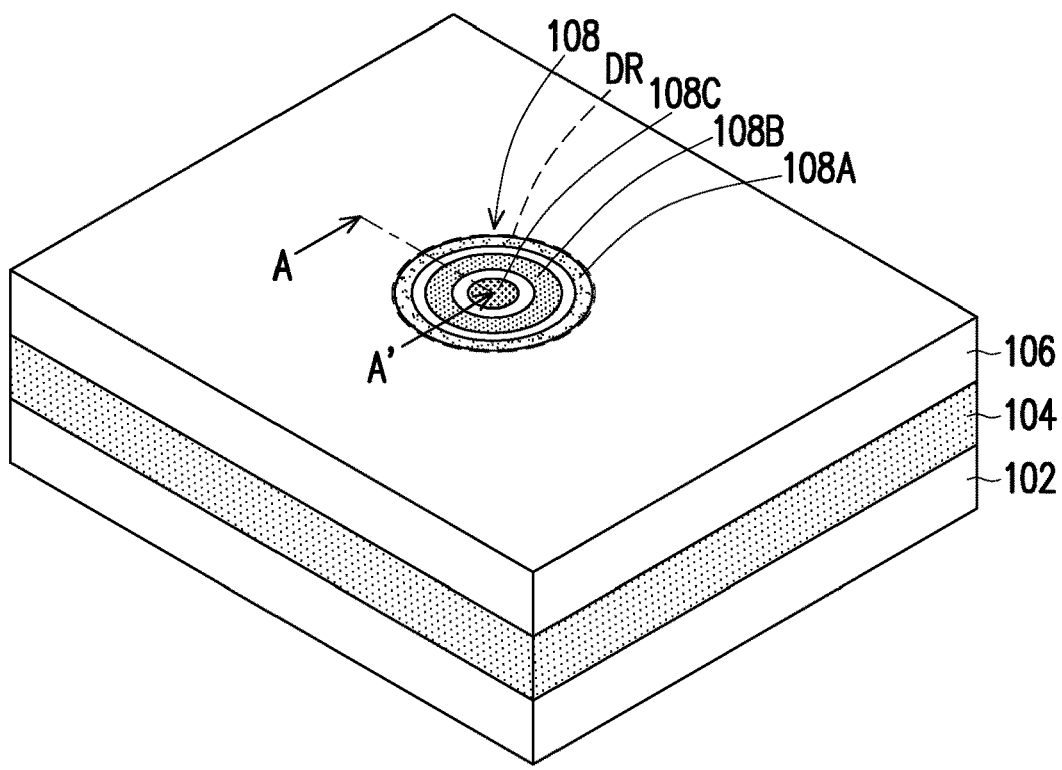
Figure 2B:
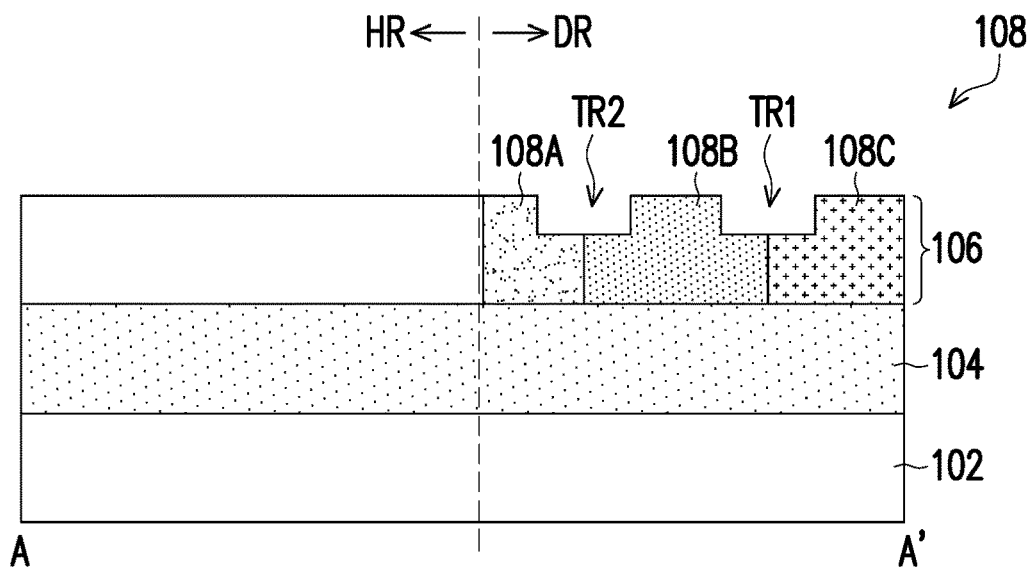

Referring to FIG. 2A, and a sectional view shown in FIG. 2B taken along the lines A-A' of FIG. 2A, a semiconductor device 108 is formed on the semiconductor substrate 102 to define a device region DR on the semiconductor substrate 102. In some embodiments, the semiconductor device 108 includes a circular or annular rib structure 108B and doped regions 108A and 108C located on two opposite sides of the rib structure 108B. The doped region 108A and the doped region 108C may be of opposite conductivity types. For example, if the doped region 108A is a N-type doped region, then the doped region 108C is a P-type doped region. Alternatively, if the doped region 108A is a P-type doped region, then the doped region 108C is a N-type doped region. In certain embodiments, the doped regions 108A and 108C may also adopt a circular or annular structure.

In some embodiments, the semiconductor device 108 including the rib structure 108B and doped regions 108A and 108C are formed by patterning and doping the semiconductive material layer 106. For example, in some embodiments, the semiconductive material layer 106 may be patterned to form a first trench TR1, and then patterned to form a second trench TR2 that surrounds the first trench TR1. In some embodiments, the first trench TR1 surrounds the doped region 108D, the rib structure 108B surrounds the first trench TR1, the second trench surrounds the rub structure 108B, and the doped region 108A surrounds the second trench TR2. In some embodiments, the semiconductor device 108 adopts a diode structure (P-I-N diode), and dopants corresponding to the conductive types of the N-type doped region (108A or 108C) and the P-type doped region (108A or 108C) are respectively doped into the semiconductive material layer 106 (e.g. a silicon layer) to form the diode. In certain embodiments, the doped region 108A is disposed at the external rim of the rib structure 108B to serve as a cathode. Furthermore, the doped region 108D is disposed at the internal rim of the structure 108B to serve as an anode.

In the exemplary embodiment, the semiconductor device 108 include photonic or optical devices such as micro-ring modulators or Mach-Zehnder devices. However, the disclosure is not limited thereto. In some alternative embodiments, other types of photonic or optical devices/optical modulators may be included as the semiconductor device 108 and may be disposed on the device region DR of the semiconductor substrate 102.

Figure 3A:
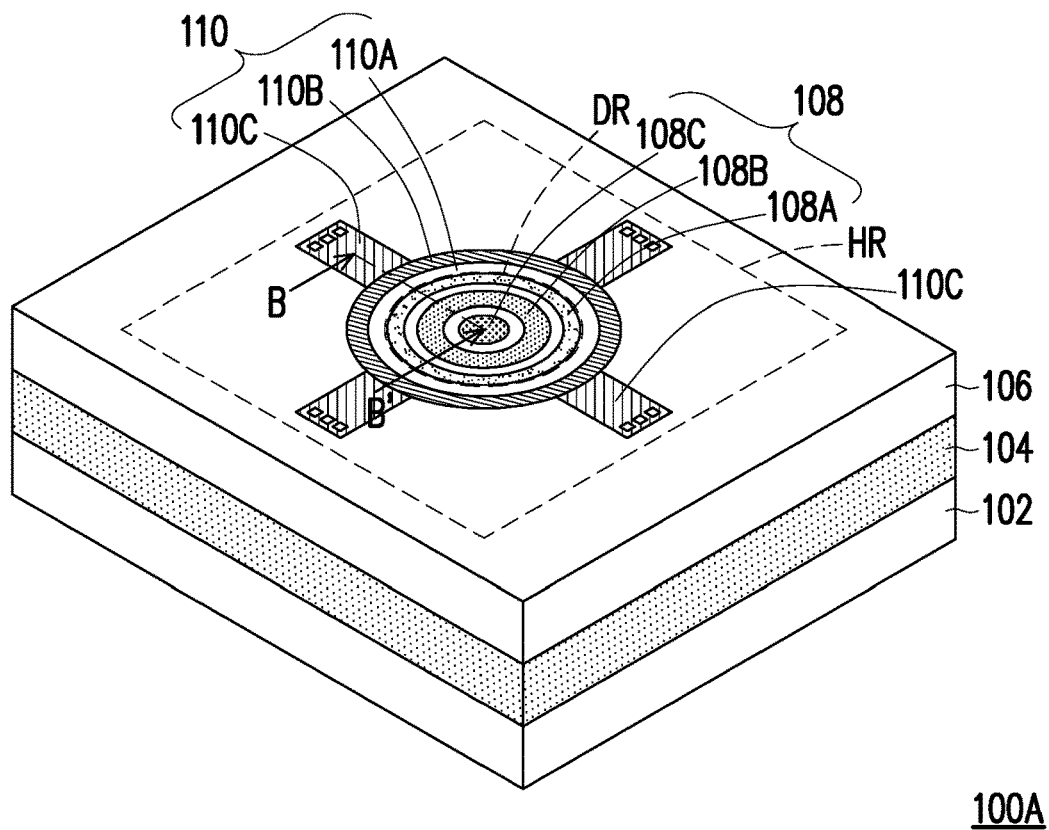
Figure 3B:
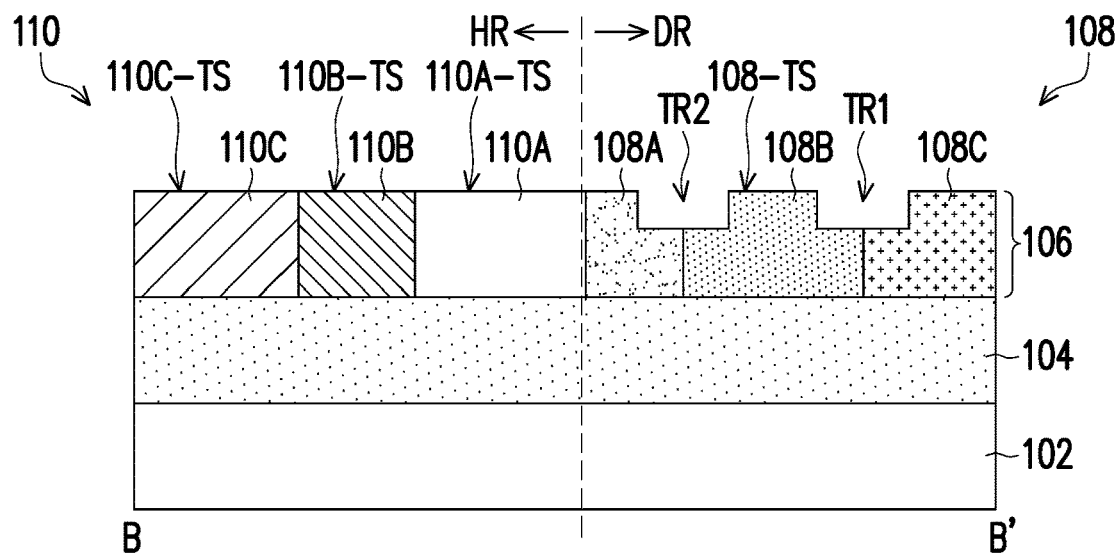

Referring to FIG. 3A, and a sectional view shown in FIG. 3B taken along the lines B-B' of FIG. 3A, a heating structure 110 is formed on the semiconductor substrate 102 to define a heating region HR surrounding the device region DR. In some embodiments, the heating structure 110 is formed by defining an intrinsic semiconductor area 110A surrounding the device region DR. In one exemplary embodiment, the intrinsic semiconductor area 110A may include intrinsic silicon. In certain embodiments, the intrinsic semiconductor area 110A surrounds the semiconductor device 108 located on the device region DR. Furthermore, the intrinsic semiconductor area 110A is in contact with the semiconductor device 108 located on the device region DR.

Figure 3C:
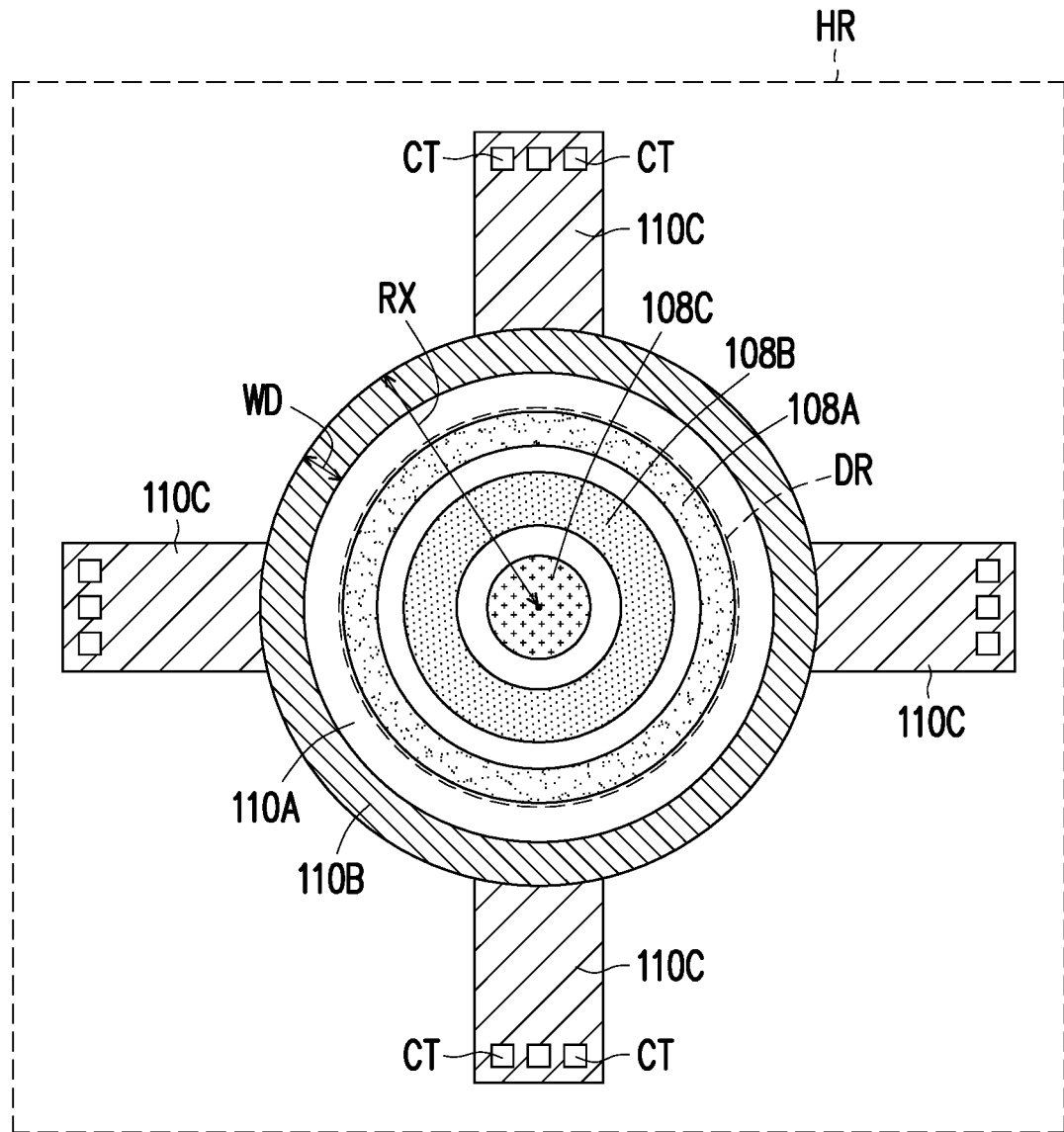

After defining the intrinsic semiconductor area 110A, a heating element 110B and heating pads 110C are formed on the semiconductor substrate 102 in the heating region HR to accomplish a semiconductor structure 100A of the exemplary embodiment. In some embodiments, a top surface 110C-TS of the heating pads 110C may be substantially aligned and coplanar with a top surface 110B-TS of the heating element 110B, a top surface 110A-TS of the intrinsic semiconductor area 110A, and a top surface 108-TS of the semiconductor device 108. To more clearly explain the arrangements of the heating element 110B and heating pads 110C, a top view of the semiconductor structure 100A is illustrated in FIG. 3C. Referring to FIG. 3A to FIG. 3C, the heating element 110B is located at a periphery of the intrinsic semiconductor area 110A to surround the semiconductor device 108. As illustrated in FIG. 3C, in some embodiments, the heating element 110B is a circular heating element, and the semiconductor device 108 is located within an area surrounded by the circular heating element 110B. In some embodiments, when the heating element 110B is a circular heating element, then a circle forming the heating element 110B may have a radius of Rx, while a width of the heating element 110B is WD. In certain embodiments, a ratio of the width WD to the radius Rx (WD:Rx) is in a range of 1:1.5 to 1:4.

In the exemplary embodiment, a material of the heating element 110B includes doped silicon, copper, tantalum nitride or some other electrically conducting materials. For example, in one embodiment, when the semiconductive material layer 106 includes silicon, then a heating element 110B may be formed by doping the semiconductive material layer 106 to form a doped silicon layer. In some embodiments, when the heating element 110B is a heavily doped region of a first conductivity type, then the doped region 108A of the semiconductor device 108 has a second conductivity type opposite to the first conductivity type. In other words, when the heating element 110B is a heavily doped P-type region, then the doped region 108A of the semiconductor device 108 is a N-type doped region (or heavily doped N-type region), and the N-type doped region is in contact with the intrinsic semiconductor area 110A. Alternatively, when the heating element 110B is a heavily doped N-type region, then the doped region 108A of the semiconductor device 108 is a P-type doped region (or heavily doped P-type region), and the P-type doped region is in contact with the intrinsic semiconductor area 110A.

In some other embodiments, when the heating element 110B includes copper or tantalum nitride or other electrically conductive materials, then the semiconductive material layer 106 may be partially removed through a patterning process to form recesses. For example, the patterning process may include a photolithography process and an etching process. Subsequently, the heating element 110B including copper, tantalum nitride or other conductive materials may be formed in the recesses by using a suitable process such as atomic layer deposition (ALD), chemical vapor deposition (CVD), physical vapor deposition (PVD), plating, or a combination thereof.

As further illustrated in FIG. 3A to FIG. 3C, in some embodiments, heating pads 110C are formed around the heating element 110B and are joined with the heating element 110B. For example, in the illustrated embodiment, four heating pads 110C are formed around the heating element 110B and are joined with the heating element 110B. The heating pads 110C may be joined with the heating element 110B in a way that they are equally spaced apart from one another. In some embodiments, a material of the heating pads 110C includes doped silicon, copper, tantalum nitride or some other electrically conducting materials. In one embodiment, the material of the heating pads 110C is the same as the material of the heating element 110B. For example, the heating element 110B and the heating pads 110C may both be formed by doping the semiconductive material layer 106 (e.g. to form doped silicon). In some alternative embodiments, the material of the heating pads 110C is different that the material of the heating element 110B. For example, the heating element 110B may include doped silicon while the heating pads 110C may include copper. Furthermore, in some embodiments, the heating pads 110C may be formed in the same step or in different/ separate steps. For example, if the heating element 110B and the heating pads 110C are formed of the same material, then they may be formed together in a single step. Alternatively, if the heating element 110B and the heating pads 110C are formed of different materials, then the heating pads 110C may be formed after forming the heating elements 110B.

In some embodiments, each of the heating pads 110C may include contact structures CT located thereon. Although each of the heating pads 110C are illustrated to include a plurality of contact structures CT, however, the disclosure is not limited thereto. In some other embodiments, the number of contact structure CT located on each heating pads 110C may be one or more. In some embodiments, a voltage may be supplied from the contact structures CT through the heating pads 110C in order to control a temperature of the heating element 110B. In other words, the heating pads 110C may be electrically connected to a voltage supplier through the contact structures CT, The intrinsic semiconductor area 110A, the heating element 110B and the heating pads 110C together constitute the heating structure 110, whereby the heating structure 110 controls a temperature surrounding the semiconductor device 108. Up to here, a semiconductor structure 100A according to some exemplary embodiments of the present disclosure may be accomplished.

Figure 4:
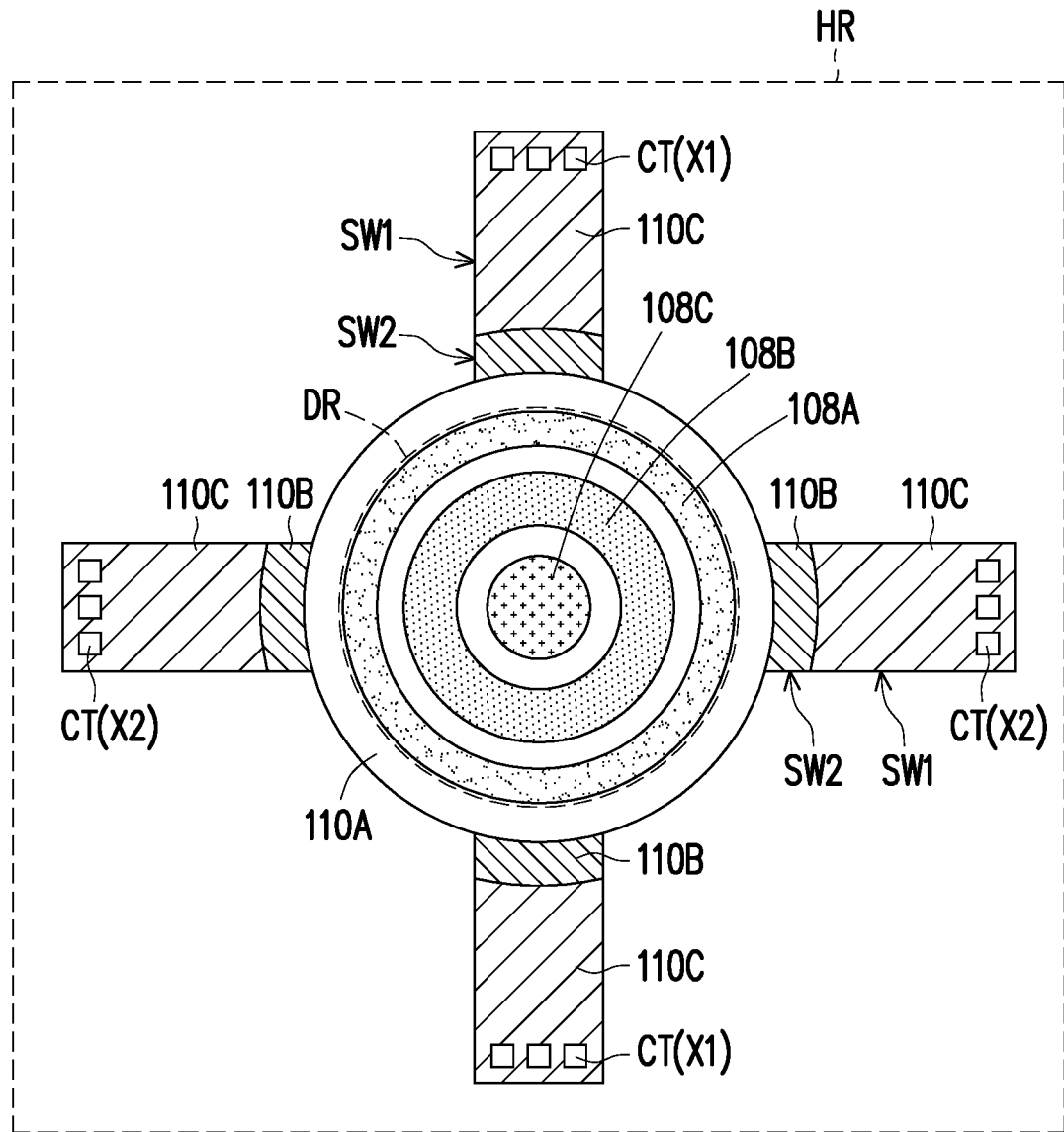
FIG. 4 is a top view of a semiconductor structure according to some other exemplary embodiments of the present disclosure.

FIG. 4 is a top view of a semiconductor structure according to some other exemplary embodiments of the present disclosure. The semiconductor structure 100B illustrated in FIG. 4 is similar to the semiconductor structure 100A illustrated in FIG. 3C. Therefore, the same reference numerals are used to refer to the same or liked parts, and its detailed description will not be repeated herein. The difference between the embodiments is in the design of the heating element 110B. As illustrated in FIG. 3C, the heating element 110B is a circular heating element. However, the disclosure is not limited thereto. For example, as illustrated in FIG. 4, a plurality of heating elements 110B is located at the periphery of the intrinsic semiconductor area 110A, whereas the heating elements 110B have a substantially rectangular shape or square shape.

In the exemplary embodiment, four heating elements 110B are located at the periphery of the intrinsic semiconductor area 110A, whereas the heating elements 110B are equally spaced apart from one another. Furthermore, four heating pads 110C are respectively joined with each of the heating elements 110B. In some embodiments, sidewalls SW1 of the plurality of heating pads 110C are aligned with sidewalls SW2 of the plurality of heating elements 110B. In certain embodiments, since a plurality of heating elements 110B exists, the heating of the plurality of heating elements 110B may be separately or individually controlled. For example, some of the heating pads 110C may be heated by a voltage supplied from a voltage supplier X1, while some other heating pads 110C may be heated by a voltage supplied from another voltage supplier X2, and whereby the voltage is supplied to the heating pads 110C through the contact structures CT. In some embodiments, when some of the heating elements 110B are heated by a voltage supplied from one of the voltage suppliers (X1 or X2) through the contact structures CT, some other heating elements 110B may act as back-up heating elements that remain unheated without suppling voltages. In other words, the heating of the heating elements 110B may be turned on or turned off based on actual requirement, and there is no particular limitation in the way of controlling the heating of the heating elements 110B through the different voltage suppliers (X1 or X2).

Figure 5:
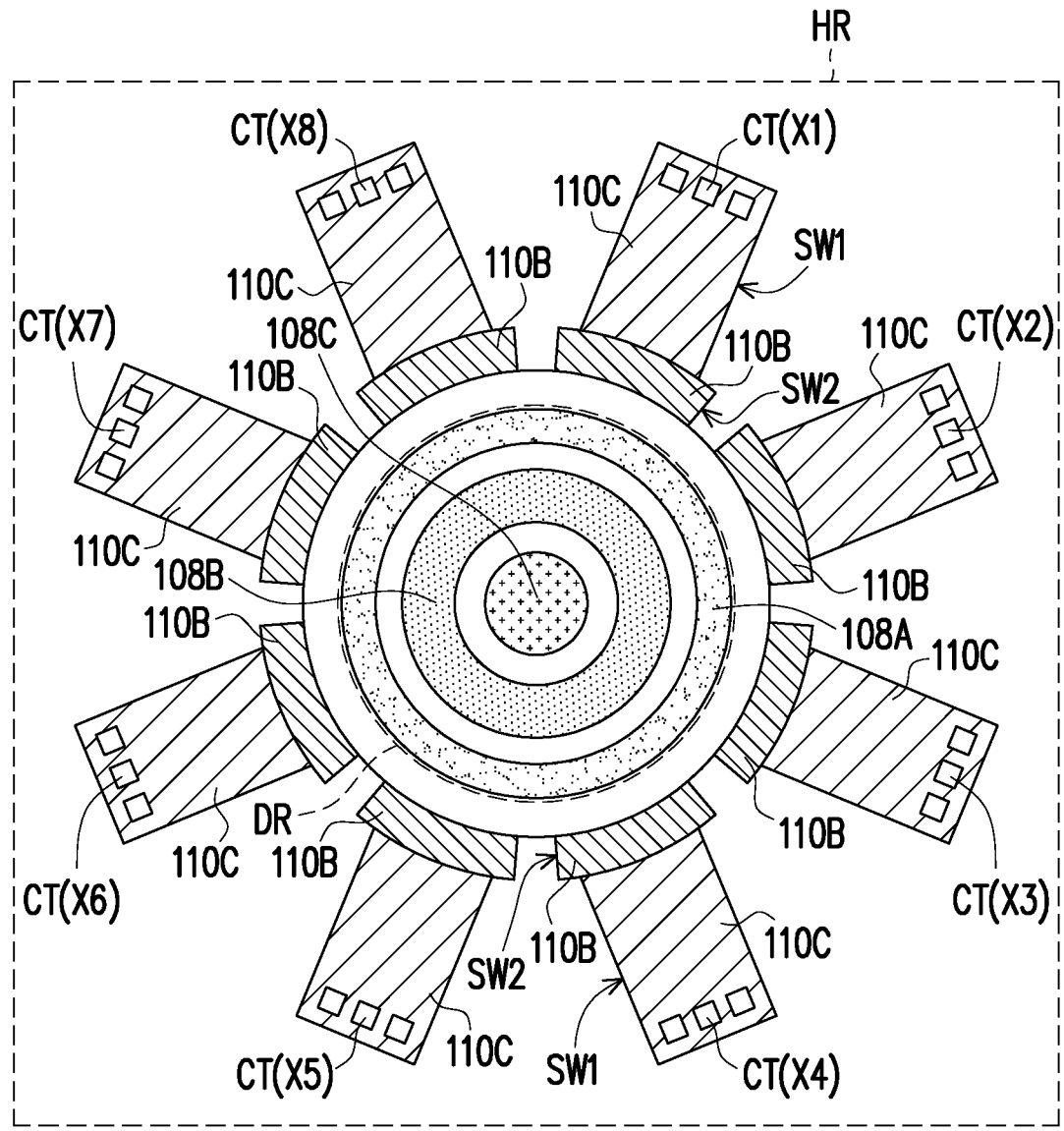
FIG. 5 is a top view of a semiconductor structure according to some other exemplary embodiments of the present disclosure.

FIG. 5 is a top view of a semiconductor structure according to some other exemplary embodiments of the present disclosure. The semiconductor structure 100C illustrated in FIG. 5 is similar to the semiconductor structure 100B illustrated in FIG. 4. Therefore, the same reference numerals are used to refer to the same or liked parts, and its detailed description will not be repeated herein. The difference between the embodiments is in the design and the number of the heating elements 110B and heating pads 110C. As illustrated in FIG. 4, there are respectively four heating pads 110C joined with four heating elements 110B. However, the disclosure is not limited thereto. For example, as illustrated in FIG. 5, there are eight heating pads 110C joined with eight heating elements 110B. It should be noted that the number of heating elements 110B and heating pads 110C is not limited to those illustrated in the present disclosure, and may be appropriately adjusted based on design requirement.

As illustrated in FIG. 5, in the exemplary embodiment, the heating pads 110C are joined with each of the heating elements 110B in a way that their sidewalls are not aligned. For example, the sidewalls SW2 of the plurality of heating pads 110C are not aligned with the sidewalls SW2 of the plurality of heating elements 110B. In some embodiments, the heating elements 110B are located at the periphery of the intrinsic semiconductor area 110A and arranged in a circular arrangement. In certain embodiments, the heating of each of the heating elements 110B may be separately or individually controlled. In other words, the plurality of heating pads 110C may be respectively connected to a voltage supplier X1, a voltage supplier X2, a voltage supplier X3, a voltage supplier X4, a voltage supplier X5, a voltage supplier X6, a voltage supplier X7 and a voltage supplier X8 for individually controlling the heating and temperature of the heating elements 110B and heating pads 110C.

Figure 6A:
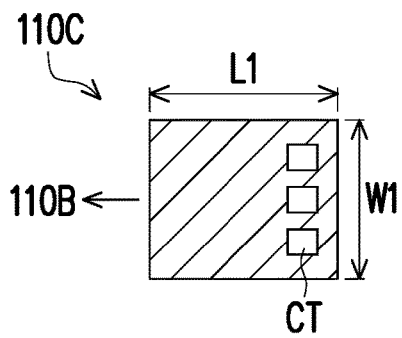
FIG. 6A to FIG. 6D are top views of a heating pad according to some exemplary embodiments of the present disclosure.
Figure 6B:
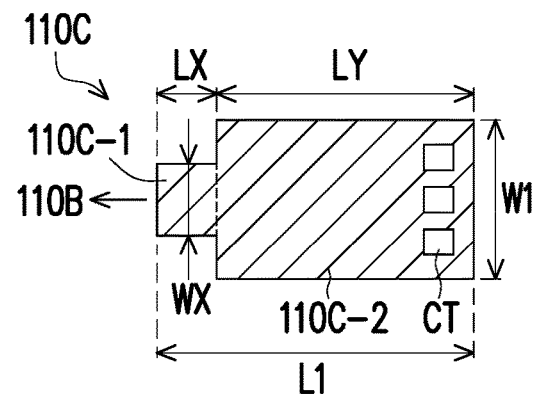

FIG. 6A to FIG. 6D are top views of a heating pad according to some exemplary embodiments of the present disclosure. In the previous embodiments, the heating pads HOC are shown to have a substantially rectangular or square shape, but the disclosure is not limited thereto. In the present disclosure, the heating pads 110C may have various different designs as shown in FIG. 6A to FIG. 6B, and these different designs may be applied to each of the different embodiments.

Referring to FIG. 6A, in one embodiment, the heating pad 110C may have a substantially rectangular or square shape, whereby a first end of the heating pad 110C is joined with the heating elements 110B, while a second end of the heating pad 110C includes the contact structures CT. In such embodiments, the heating pad 110C may have a length of L1 (first end to second end) and a width of W1, whereby a ratio of the length L1 to the width W1 (L1:W1) may be in a range of 5:1 to 1:4. The dimensions of the heating pad 110C is controlled in such a range to optimize the heating performance and heat transfer to the heating elements 110B.

Referring to FIG. 6B, in one embodiment, the heating pad 110C may include a first portion 110C-1 and a second portion 110C-2 joined with the first portion 110C-1. In some embodiments, the first portion 110C-1 is joined with the heating element 110B and the second portion 110C-2 includes a plurality of contact structures CT. In some embodiments, a width WX of the first portion 110C-1 is smaller than a width W1 of the second portion 110C-2. In certain embodiments, a ratio of the width WX of the first portion 110C-1 to the width W1 of the second portion 110C-2 (WX:W1) is in a range of 1:2 to 1:5. Furthermore, in some embodiments, when a length of the first portion 110C-1 is LX and a length of the second portion 110C-2 is LY, then a ratio of LX:LY is in a range of 1:1 to 1:9. Furthermore, a ratio of the length L1 to the width W1 (L1:W1) of the heating pad 110C including the two portions may still be controlled in a range of 5:1 to 1:4. By controlling the dimensions of the heating pad 110C having two portions in such a range, the heating performance and heat transfer to the heating elements 110B may be optimized. Furthermore, by designing the heating pad HOC to include the two portions, the temperature difference between the environment surrounding the heating structure 110 and the semiconductor device 108 may be decreased. In other words, more uniform heating (smaller $\Delta T$ (change in temperature)) around the heating structure 110 and the semiconductor device 108 may be achieved.

Figure 6C:
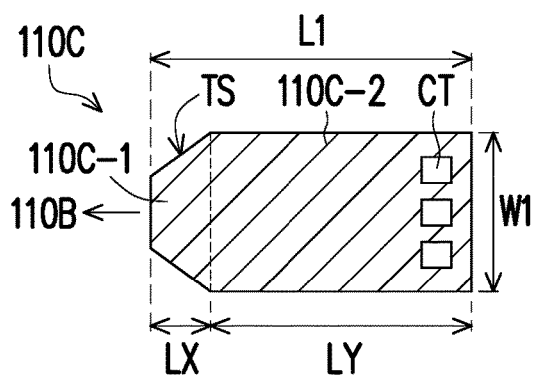

Referring to FIG. 6C, in one embodiment, the heating pad 110C may also include a first portion 110C-1 and a second portion 110C-2 joined with the first portion 110C-1. The first portion 110C-1 is joined with the heating element 110B and the second portion 110C-2 includes the plurality of contact structures CT. In the illustrated embodiment, the first portion 110C-1 has tapered sidewalls TS joining the heating element 110B to the second portion 110C-2 of the heating pad 110C. Similar to the previous embodiment, a length of the first portion 110C-1 is LX and a length of the second portion 110C-2 is LY, and a ratio of LX:LY is in a range of 1:1 to 1:9. Furthermore, a ratio of the length L1 to the width W1 (L1:W1) of the heating pad 110C including the two portions may still be controlled in a range of 5:1 to 1:4. By controlling the dimensions of the heating pad 110C having two portions in such a range, the heating performance and heat transfer to the heating elements HOB may be optimized. Similarly, more uniform heating (smaller ΔT (change in temperature)) around the heating structure 110 and the semiconductor device 108 may be achieved with a heating pad 110C having the two-portion design.

Figure 6D:
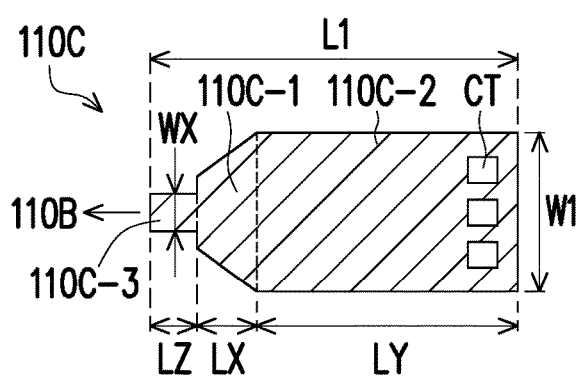

Referring to FIG. 6D, the heating pad 110C may include a first portion 110C-1 and a second portion 110C-2 joined with the first portion 110C-1, and further include a third portion 110C-3 joined with the first portion 110C-1. In other words, the first portion 110C-1 is sandwiched in between the second portion 110C-2 and the third portion 110C-3, and physically connects the second portion 110C-2 to the third portion 110C-3. In some embodiments, the third portion 110C-3 is joined with the heating element 110B and the second portion 110C-2 includes the plurality of contact structures CT. In the exemplary embodiment, a length of the first portion 110C-1 is LX, a length of the second portion 110C-2 is LY, and a length of the third portion 110C-3 is LZ, wherein a ratio of LX:LY:LZ is in a range of 1:0.5:1 to 1:2:18. In some embodiments, a width WX of the third portion 110C-3 to the width W1 of the second portion 110C-2 (WX:W1) is in a range of 1:2 to 1:5. Furthermore, the first portion 110C-1 has tapered sidewalls and is joining the third portion 110C-3 to the second portion 110C-2. Similarly, a ratio of the length L1 to the width W1 (L1:W1) of the heating pad 110C including the three portions may still be controlled in a range of 5:1 to 1:4. By controlling the dimensions of the heating pad 110C having three portions in such a range, the heating performance and heat transfer to the heating elements 110B may be optimized. Similarly, more uniform heating (smaller ΔT (change in temperature)) around the heating structure 110 and the semiconductor device 108 may be achieved with a heating pad 110 having the three-portion design.

In the present disclosure, when a plurality of heating pads 110C exists in the heating structure 110, then the design of each of the plurality of heating pads 110C may be the same or different. For example, in the previously illustrated embodiments, all of the heating pads 110C are shown to have a substantially rectangular shape or square shape (the design shown in FIG. 6A). However, the disclosure is not limited thereto. In some alternative embodiments, in a heating structure 110 having a plurality of heating pads 110C, some of the heating pads 110C may have a substantially rectangular shape or square shape (design shown in FIG. 6A), while some other heating pads 110C adopts a two-portion design (FIG. 6B or FIG. 6C), In other words, the different designs of heating pads 110C illustrated in FIG. 6A to FIG. 6D may be used alone (having one type of design) in one heating structure 110, or used in combination (having multiple type of design) in one heating structure 110.

Figure 7A:
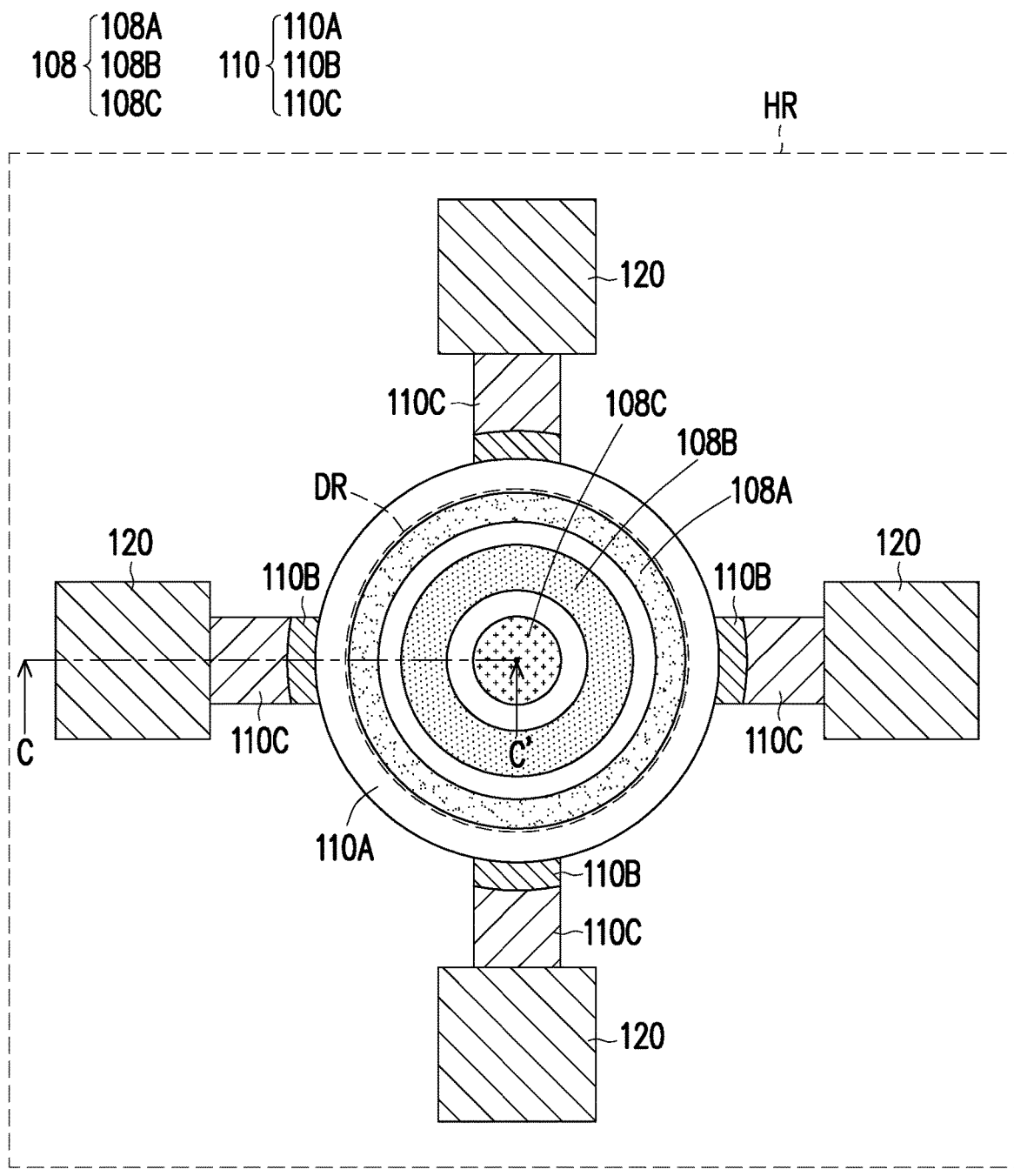
FIG. 7A and FIG. 7B are top and sectional views of a semiconductor structure according to some other exemplary embodiments of the present disclosure.
Figure 7B:
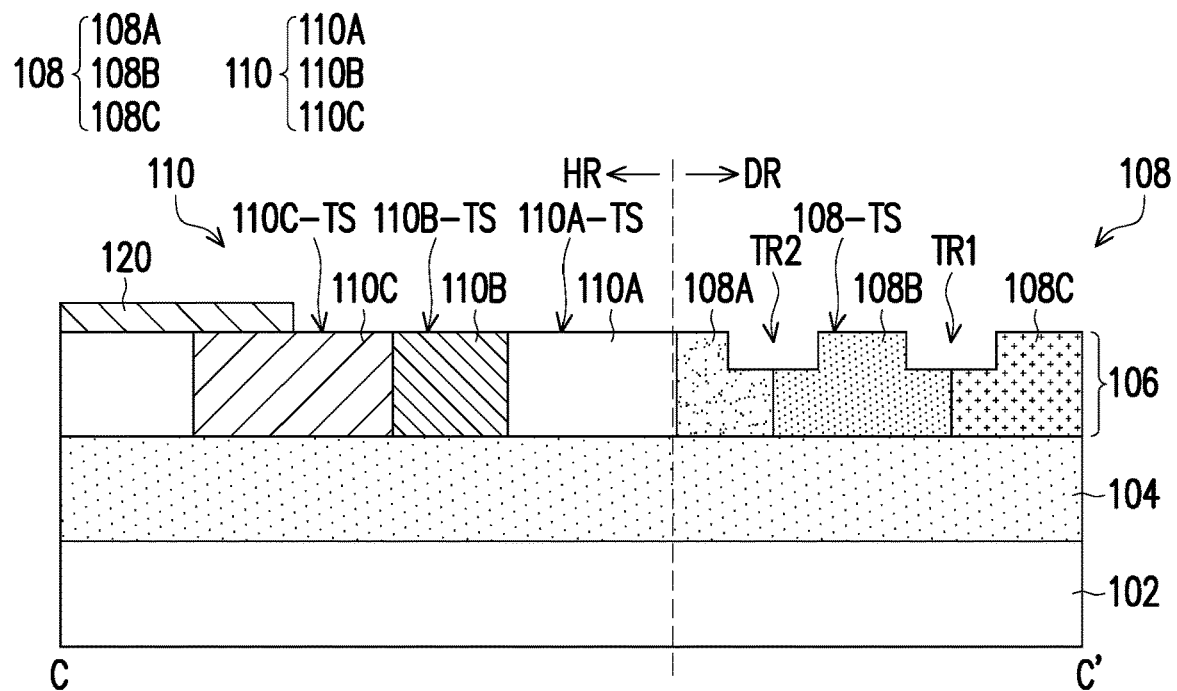

FIG. 7A and FIG. 7B are top and sectional views of a semiconductor structure according to some other exemplary embodiments of the present disclosure. FIG. 7B illustrates the sectional view take along the line C-C' of FIG. 7A. The semiconductor structure 100D illustrated in FIG. 7A and FIG. 7B is similar to the semiconductor structure 100B illustrated in FIG. 4. Therefore, the same reference numerals are used to refer to the same or liked parts, and its detailed description will not be repeated herein. The difference between the embodiments is that a plurality of conductive pads 120 is further provided in the semiconductor structure 100D of FIG. 7A and FIG. 7B.

As illustrated in FIG. 7A and FIG. 7B, conductive pads 120 are further located over each of the heating pads 110C and electrically connected to the heating pads 110C. In some embodiments, the conductive pads 120 are located on the heating pads 110C and partially overlaps with the heating pads 110C. The conductive pads 120 may be electrically connected to the heating pads 110C through the contact structures CT (shown iii FIG. 4). Furthermore, a voltage is supplied to the heating pads 110 through the contact structures CT and the conductive pads 120. In other words, the conductive pads 120 may be electrically connected to a voltage supplier. In some embodiments, the conductive pads 120 may include conductive materials such as copper, tungsten, aluminum, silver, gold or a combination thereof. In certain embodiments, the conductive pads 120 are disposed on a top surface 110C-TS of the heating pads 110C and is in physical contact with the heating pads 110C. Furthermore, the top surface 110C-TS of the heating pads 110C may be substantially aligned and coplanar with a top surface 110B-TS of the heating element 110B, a top surface 110A-TS of the intrinsic semiconductor area 110A, and a top surface 108-TS of the semiconductor device 108.

Figure 8:
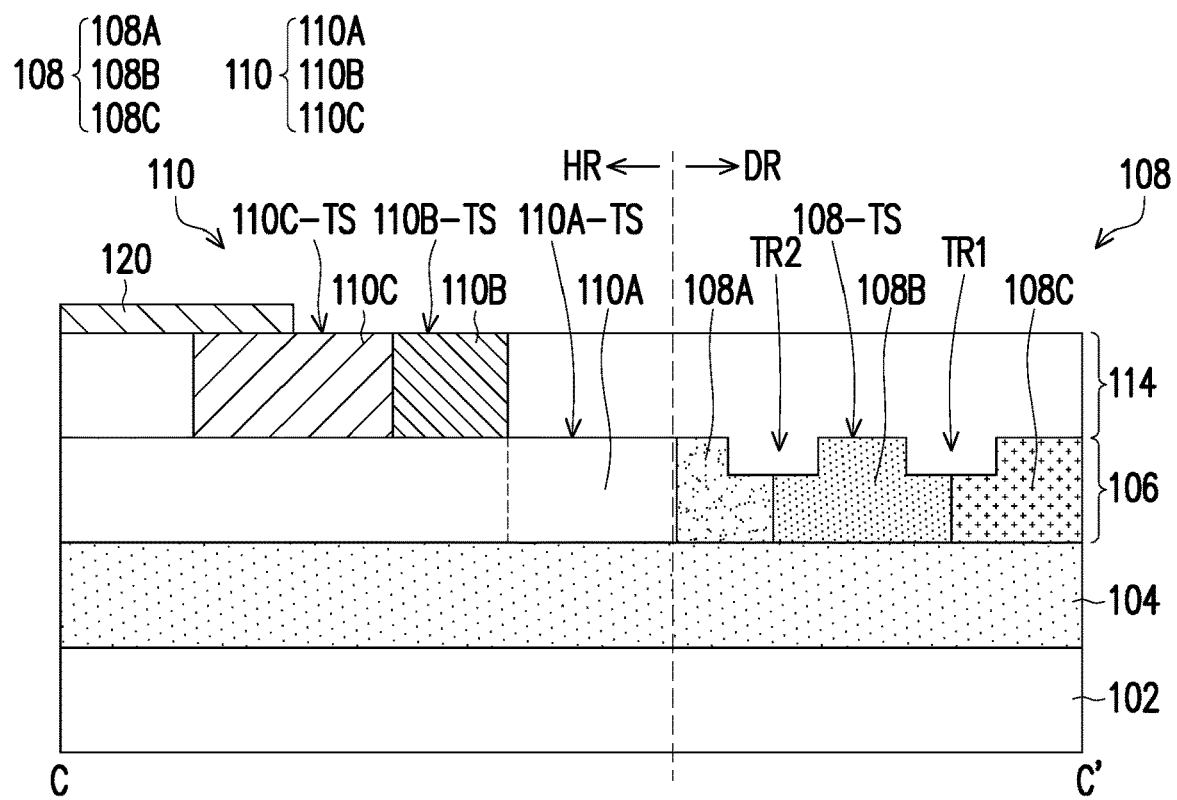
FIG. 8 is a sectional view of a semiconductor structure according to some other exemplary embodiments of the present disclosure.

FIG. 8 is a sectional view of a semiconductor structure according to some other exemplary embodiments of the present disclosure. The sectional view of the semiconductor structure illustrated in FIG. 8 is similar to the sectional view of the semiconductor structure 100D illustrated in FIG. 7B. Therefore, the same reference numerals are used to refer to the same or liked parts, and its detailed description will not be repeated herein. The difference between the embodiments is in the arrangement of the layers.

In FIG. 7B, the top surface (110C-TS, 110B-TS and 110A-TS) of the heating structure 110 is substantially aligned with the top surface 108-TS of the semiconductor device 108. However, the disclosure is not limited thereto, and the heating structure 110 and the semiconductor device 105 may be located at different levels on the semiconductor substrate 102. For example, as illustrated in FIG. 8, the semiconductor device 108 may be still formed on the insulating layer 104 by selectively doping the semiconductive material layer 106, Similarly, an intrinsic semiconductor area 110A may still be defined in the semiconductive material layer 106 as being surrounding the semiconductor device 105 on the device region DR.

In some embodiments, another semiconductive material layer 114 is disposed on the semiconductive material layer 106. In certain embodiments, the heating element 110B and heating pads 110C are formed by doping the semiconductive material layer 111 or by patterning the semiconductive material layer 114 and forming the heating element 110B and heating pads 110C through deposition and/or plating techniques. In other words, the heating element 110B and heating pads 110C of the heating structure 110 may be located on the substrate 102 at a level higher than that of the semiconductor device 108. In some embodiments, the top surface 110C-TS of the heating pads 110C and the top surface 110B-TS of the heating elements 110B are at a level higher than the top surface 108-TS of the semiconductor device 108. After forming the semiconductive material layer 114 and forming the heating element 110B and heating pads 110C, the conductive pads 120 may be optionally disposed on the heating pads 110C and be electrically connected to the heating pads 110C.

Figure 9:
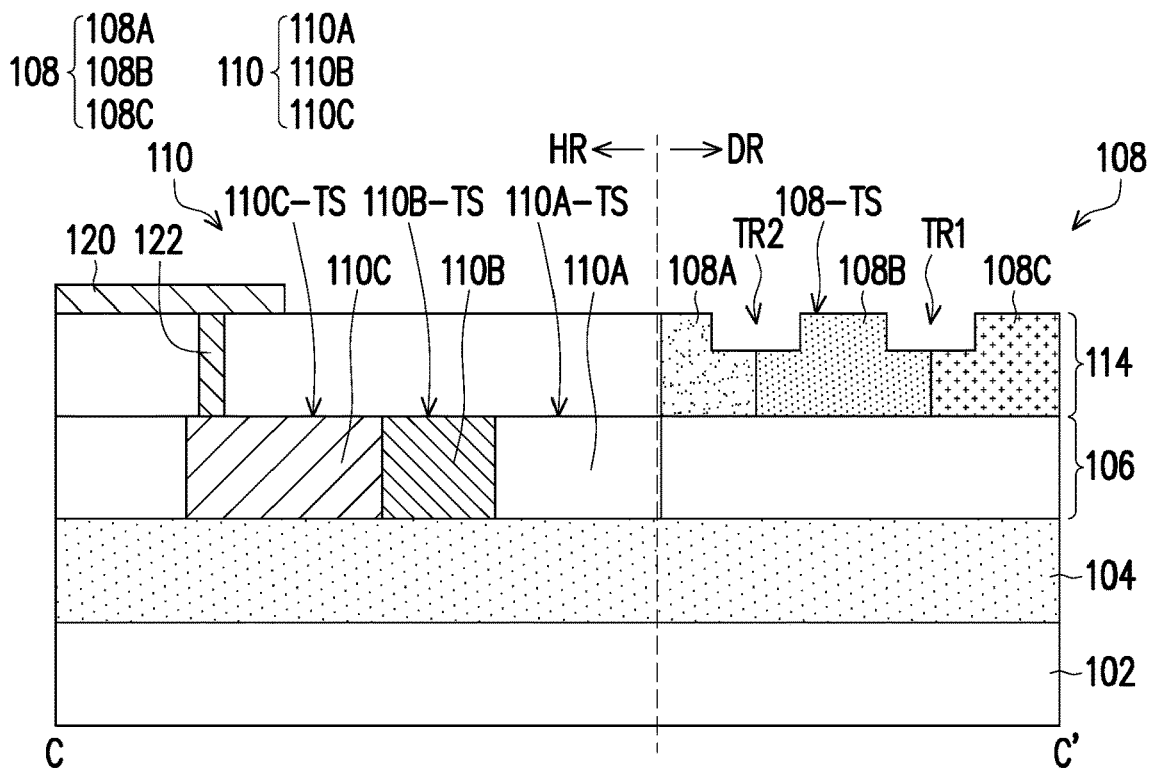
FIG. 9 is a sectional view of a semiconductor structure according to some other exemplary embodiments of the present disclosure.

FIG. 9 is a sectional view of a semiconductor structure according to some other exemplary embodiments of the present disclosure. The sectional view of the semiconductor structure illustrated in FIG. 9 is similar to the sectional view of the semiconductor structure 100D illustrated in FIG. 7B. Therefore, the same reference numerals are used to refer to the same or liked parts, and its detailed description will not be repeated herein. The difference between the embodiments is in the arrangement of the layers.

As illustrated in FIG. 9, the heating structure 110 may be formed by defining the intrinsic semiconductor area 110A in the semiconductive material layer 106. Thereafter, the heating element 110B and heating pads 110C are formed by doping the semiconductive material layer 106 or by patterning the semiconductive material layer 106 and forming the heating element HOB and heating pads 110C through deposition and/or plating techniques. In some embodiments, after forming the heating structure 110, another semiconductive material layer 114 is disposed on the semiconductive material layer 106. In a similar way, the semiconductor device 108 may be formed by selectively doping the semiconductive material layer 114.

In some embodiments, the intrinsic semiconductor area 110A, the heating element 110B and the heating pads 110C of the heating structure 110 may be located on the substrate 102 at a level lower than that of the semiconductor device 108. In some embodiments, the top surface 110A-TS of the intrinsic semiconductor area 110A, the top surface 110C-TS of the heating pads 110C and the top surface 110B-TS of the heating elements 110B are at a level lower than the top surface 108-TS of the semiconductor device 108. After forming the semiconductive material layer 114 and forming the semiconductor device 108, the conductive pads 120 may be optionally disposed over the heating pads 110C and be electrically connected to the heating pads 110C. For example, the conductive pads 120 may be electrically connected to the heating pads 110C through connecting vias 122 that pass through the semiconductive material layer 114.

Figure 10:
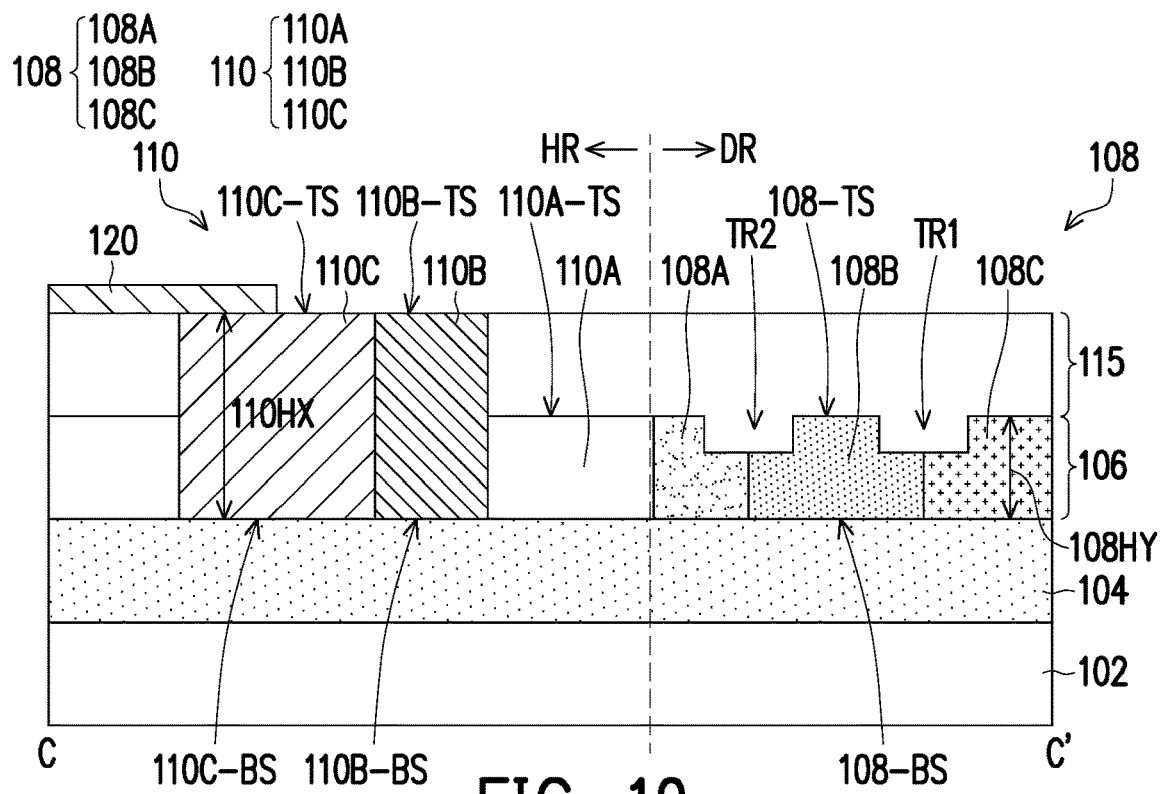
FIG. 10 is a sectional view of a semiconductor structure according to some other exemplary embodiments of the present disclosure.

FIG. 10 is a sectional view of a semiconductor structure according to some other exemplary embodiments of the present disclosure. The sectional view of the semiconductor structure illustrated in FIG. 10 is similar to the sectional view of the semiconductor structure 100D illustrated in FIG. 7B. Therefore, the same reference numerals are used to refer to the same or liked parts, and its detailed description will not be repeated herein. The difference between the embodiments is in the design and arrangement of the layers.

As illustrated in FIG. 10, the semiconductor device 108 may be still formed on the insulating layer 104 by selectively doping the semiconductive material layer 106. Similarly, an intrinsic semiconductor area 110A may still be defined in the semiconductive material layer 106 as being surrounding the semiconductor device 108 on the device region DR. After defining the intrinsic semiconductor area 110A, the semiconductive material layer 106 may be patterned to form recesses that reveal the insulating layer 104. Subsequently, the heating element 110B and heating pads 110C may be formed within the recesses through deposition and/or plating techniques.

In the exemplary embodiment, the heating element 110B and heating pads 110C of the heating structure are formed with a height 110HX that is greater than a height 108HY of the semiconductor device 108. After forming the heating element 110B and heating pads 110C with greater height, a support layer 115 (or insulating layer) may be formed on the semiconductive material layer 106 to surround the heating element 110B and heating pads. Subsequently, the conductive pads 120 may be optionally disposed on the support layer 115 and over the heating pads 110C and be electrically connected to the heating pads 110C.

In the above-mentioned embodiments, the semiconductor structure at least includes a heating structure surrounding the semiconductor device on the device region. Therefore, the temperature around the heating structure and the semiconductor device may be appropriately controlled. As such, performance degradation of the semiconductor structure due to coupling gap tolerance or resonant wavelength shift arising from changes in material properties from environment or processing may be alleviated. Overall, the performance of semiconductor devices, for example, photonic or optical devices such as micro-ring modulators or Mach-Zehnder devices etc. may be improved.

In accordance with some embodiments of the present disclosure, a semiconductor structure includes a semiconductor substrate, a semiconductor device and a heating structure. The semiconductor substrate includes a device region and a heating region surrounding the device region. The semiconductor device is located on the device region. The heating structure is located on the heating region and includes an intrinsic semiconductor area, at least one heating element and at least one heating pad. The intrinsic semiconductor area is surrounding the semiconductor device. The at least one heating element is located at a periphery of the intrinsic semiconductor area. The at least one heating pad is joined with the at least one heating element, wherein the at least one heating pad includes a plurality of contact structures, and a voltage is supplied from the plurality of contact structures to control a temperature of the at least one heating element.

In accordance with some other embodiments of the present disclosure, a semiconductor structure includes a substrate, a heating structure and a semiconductor device. The heating structure is located on the substrate and include an intrinsic semiconductor area, at least one heating element and at least one heating pad. The at least one heating element is located at a periphery of the intrinsic semiconductor area, and is a heavily doped region of a first conductivity type. The at least one heating pad is joined with the at least one heating element, wherein the at least one heating pad includes a plurality of contact structures, and a voltage is supplied from the plurality of contact structures to the at least one heating pad for controlling a temperature of the at least one heating element. The semiconductor device is located on the substrate within an area surrounded by the heating structure, wherein the intrinsic semiconductor area is located in between the heavily doped region of the at least one heating element and a doped region of a second conductivity type of the semiconductor device.

In accordance with yet another embodiment of the present disclosure, a method of fabricating the semiconductor structure is described. The method includes the following steps. A semiconductor substrate is provided. A semiconductor device is formed on the semiconductor substrate to define a device region on the semiconductor substrate. A heating structure is formed on the semiconductor substrate to define a heating region surrounding the device region. The formation of the heating structure includes the following steps. An intrinsic semiconductor area surrounding the device region is defined. At least one heating element is formed to be located at a periphery of the intrinsic semiconductor area and surrounding the semiconductor device. At least one heating pad is formed to be joined with the at least one heating element, wherein the at least one heating pad includes a plurality of contact structures, and a voltage is supplied from the plurality of contact structures to control a temperature of the at least one heating element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a substrate;
    a semiconductor device disposed on the substrate, wherein the semiconductor device comprises a first doped region, an intermediate region located within an area surrounded by the first doped region, and a second doped region located within an area surrounded by the first doped region and the intermediate region, and the first doped region and the second doped region have opposite conductivity types;
    a heating structure surrounding the semiconductor device, wherein the heating structure comprises:
        an intrinsic semiconductor area, wherein the semiconductor device is located within an area surrounded by the intrinsic semiconductor area, and the intrinsic semiconductor area is physically separated from the intermediate region by the first doped region;
        at least one heating element located at a periphery of the intrinsic semiconductor area; and
            at least one heating pad joined with the at least one heating element, wherein the at least one heating pad comprises a plurality of contact structures, and the contact structures are arranged to receive a voltage to control a temperature of the at least on heating element.

2. The structure according to claim 1, wherein the semiconductor device further comprises a first trench located in between the second doped region and the intermediate region, and a second trench located in between the intermediate region and the first doped region.

3. The structure according to claim 1, wherein the intrinsic semiconductor area is in contact with the first doped region of the semiconductor device located on the device region and separated from the intermediate region and the second doped region.

4. The structure according to claim 1, wherein the at least one heating element is a circular heating element, and the semiconductor device is located within an area surrounded by the circular heating element, and the at least one heating pad is joined with the circular heating element.

5. The structure according to claim 1, wherein the at least on heating pad has a curved surface that is joined with a curved surface of the at least one heating element.

6. The structure according to claim 1, wherein the at least one heating pad comprises a first portion and a second portion joined with the first portion, and a width of the first portion is smaller than a width of the second portion, the first portion is joined with the at least one heating element and the second portion comprises the plurality of contact structures.

7. The structure according to claim 1, further comprising a conductive pad located over and electrically connected to the at least one heating pad.

8. The structure according to claim 1, wherein a thickness of the at least one heating element is greater than a thickness of the semiconductor device.

9. A structure, comprising:
    an insulating layer disposed on a substrate;
    a semiconductor device located on the insulating layer;
    an intrinsic semiconductor area surrounding the semiconductor device;
    at least one heating element surrounding the intrinsic semiconductor area, wherein the at least one heating element is a heavily doped region of a first conductivity type, and the intrinsic semiconductor area is sandwiched between the at least one heating element and the semiconductor device, and a distance between the at least one heating element and a boundary surface of the semiconductor device is smaller than half of a maximum width of the semiconductor device;
    a plurality of heating pads joined with the at least one heating element; and
    a voltage supplier connected to the plurality of heating pads, wherein the voltage supplier controls a temperature of the plurality of heating pads.

10. The structure according to claim 9, wherein the semiconductor device comprises a rib structure, a N-doped region and a P-doped region located at two opposite sides of the rib structure, and either one of the N-doped region and the P-doped region is in contact with the intrinsic semiconductor area.

11. The structure according to claim 10, wherein the intrinsic semiconductor area is located in between the heavily doped region of the at least one heating element and a doped region of a second conductivity type of the semiconductor device, and the doped region of the second conductivity type is the N-doped region or the P-doped region.

12. The structure according to claim 9, wherein the semiconductor device is a circular semiconductor device, and the distance between the at least one heating element and a boundary surface of the circular semiconductor device is smaller than a radius of the circular semiconductor device.

13. The structure according to claim 9, wherein the plurality of heating pads is conformally disposed around and in contact with a peripheral surface of the at least one heating element.

14. The structure according to claim 13, wherein the peripheral surface of the at least one heating element is a curved surface.

15. The structure according to claim 9, wherein a top surface of the at least one heating element is non-aligned with a top surface of the semiconductor device.

16. A structure, comprising:
    a semiconductive material layer comprising an intrinsic semiconductor area and a semiconductor device located within an area surrounded by the intrinsic semiconductor area;
    a heating element surrounding the intrinsic semiconductor area;
    a first heating pad joined with the heating element, and located on a first side of the semiconductor device;

a second heating pad joined with the heating element, and located on a second side of the semiconductor device, wherein the second side is opposite to the first side; and a third heating pad joined with the heating element, and located on a third side of the semiconductor device, wherein the third side is adjacent to the first side.

17. The structure according to claim 16, further comprising a fourth heating pad joined with the heating element, and located on a fourth side of the semiconductor device, wherein the fourth side is opposite to the third side.

18. The structure according to claim 16, wherein the heating element is a circular heating element, and the first heating pad, the second heating pad and the third heating pad are joined with the circular heating element.

19. The structure according to claim 16, wherein the semiconductor device is a micro-ring modulator or a Mach-Zehnder device.

20. The structure according to claim 16, wherein a material of the heating element comprises doped silicon, copper or tantalum nitride.

* * * * *